United States Patent
Weng et al.

(10) Patent No.: US 9,885,754 B2
(45) Date of Patent: Feb. 6, 2018

(54) INTEGRATED CIRCUIT WITH SELF-VERIFICATION FUNCTION, VERIFICATION METHOD AND METHOD FOR GENERATING A BIST SIGNATURE ADJUSTMENT CODE

(71) Applicant: Realtek Semiconductor Corp., HsinChu (TW)

(72) Inventors: Chi-Shun Weng, Hsinchu County (TW); Chun-Yi Kuo, New Taipei (TW)

(73) Assignee: Realtek Semiconductor Corp., HsinChu (TW)

( * ) Notice: Subject to any disclaimer, the term of this patent is extended or adjusted under 35 U.S.C. 154(b) by 24 days.

(21) Appl. No.: 14/753,032

(22) Filed: Jun. 29, 2015

(65) Prior Publication Data
US 2016/0003903 A1 Jan. 7, 2016

(30) Foreign Application Priority Data

Jul. 7, 2014 (TW) .............................. 103123374 A

(51) Int. Cl.
*G01R 29/00* (2006.01)
*G01R 31/3193* (2006.01)
*G01R 31/3187* (2006.01)

(52) U.S. Cl.
CPC ... *G01R 31/31935* (2013.01); *G01R 31/3187* (2013.01)

(58) Field of Classification Search
CPC ....................... G01R 31/31935; G01R 31/3187
See application file for complete search history.

(56) References Cited

U.S. PATENT DOCUMENTS

| | | | |
|---|---|---|---|
| 4,698,750 A * | 10/1987 | Wilkie | G06F 12/1433 365/185.04 |
| 2004/0193984 A1* | 9/2004 | Soundron | G11C 29/40 714/733 |
| 2006/0206771 A1* | 9/2006 | Tseng | G11C 29/40 714/733 |
| 2010/0017664 A1* | 1/2010 | Jang | G11C 29/16 714/719 |
| 2011/0231716 A1* | 9/2011 | Prakash | G11C 29/12 714/718 |
| 2013/0268746 A1* | 10/2013 | Hsu | G06F 21/572 713/2 |
| 2013/0275821 A1* | 10/2013 | Braceras | G11C 29/822 714/718 |
| 2014/0351662 A1* | 11/2014 | Braceras | G11C 29/822 714/718 |
| 2015/0243368 A1* | 8/2015 | Remington | G11C 29/024 365/94 |
| 2015/0261636 A1* | 9/2015 | Chakravarty | G11C 29/00 714/30 |

* cited by examiner

*Primary Examiner* — Thien Nguyen
(74) *Attorney, Agent, or Firm* — Winston Hsu

(57) ABSTRACT

An integrated circuit includes a Built-In Self-Test (BIST) circuit, a predetermined signature pattern and a Read Only Memory (ROM), wherein the predetermined signature pattern is stored in the integrated circuit. The ROM stores at least effective information and a BIST signature adjustment code, the BIST signature adjustment code is irrelevant to any functional information stored in the ROM; wherein the BIST circuit is used to test content stored in the ROM to generate a signature pattern, and compare the signature pattern with the predetermined signature pattern to judge if the content stored in the ROM has error.

12 Claims, 5 Drawing Sheets

INTEGRATED CIRCUIT WITH SELF-VERIFICATION FUNCTION, VERIFICATION METHOD AND METHOD FOR GENERATING A BIST SIGNATURE ADJUSTMENT CODE

BACKGROUND OF THE INVENTION

1. Field of the Invention

The present invention is related to an integrated circuit, and more particularly, to an integrated circuit with a Built-In Self-Test circuit and associated verification method.

2. Description of the Prior Art

In general, a Built-In Self-Test circuit, so called BIST circuit hereinafter, is usually disposed in a chip which needs Read Only Memory (ROM), and this BIST circuit usually can use Single Input Signature Register (SISR) algorithm or Multiple Input Signature Register (MISR) algorithm. The purpose of the BIST circuit is testing product or reading and operating all the data of the ROM to generate a signature pattern when the data of ROM needs to be decided if it is correct and comparing this signature pattern with a predetermined signature pattern to decide if the data stored in ROM has error; wherein the predetermined signature pattern is the signature pattern produced by the BIST circuit when the data of ROM has no error. More specifically, because when the data of ROM has error, it has very high probability to reflect on the signature pattern of the BIST circuit. Therefore, as long as the signature pattern generated by the BIST circuit is the same with the predetermined signature pattern, it can decide the data of the ROM has no error; otherwise, when the signature pattern generated by the BIST circuit and the predetermined signature pattern are different, that means the data of ROM has error.

The above-mentioned predetermined signature pattern will be considered to dispose on chip or off chip according to the consideration of design of designer. In general test of factory mass production, the predetermined signature pattern is disposed off chip, but the predetermined signature pattern is stored in the chip of the electronic product for some electronic products which need to execute BIST when every time turns on (for example, the chip that BIST circuit in). For these electronic products which need to execute BIST when every time turns on, when the internal ROM needs to change the stored signature pattern or other data, it makes the signature pattern generated by the BIST circuit after reading the ROM change as well. Therefore, the predetermined signature pattern stored in the chip needs to be changed correspondingly, so it needs to spend extra costs of mask and also needs extra test for testing if the timing and function of circuit is correct after the design of mask changed.

SUMMARY OF THE INVENTION

One object of the present invention is to provide an integrated circuit and associated method, which doesn't need to change the predetermined signature pattern when the code or other data stored in the ROM need to be changed, to save the costs of mask and following costs of testing.

According to an embodiment of the present invention, an integrated circuit comprises a BIST circuit, a predetermined signature pattern and a ROM, wherein the predetermined signature pattern is stored in the integrated circuit previously, the ROM stores at least one information and one BIST signature adjustment code, the BIST signature adjustment code is irrelevant to any functional information stored in the ROM; wherein the BIST circuit is arranged to test the content stored in the ROM and generate a signature pattern, and compare the signature pattern with the predetermined signature pattern to decide if the information stored in the ROM has error.

According to another embodiment of the present invention, a verification method comprises: providing a ROM which stores at least one information and one BIST signature adjustment code, wherein the BIST signature adjustment code is irrelevant to any functional information stored in the ROM; and executing BIST to the content stored in the ROM to generate a signature pattern, and comparing the signature pattern with a predetermined signature pattern to decide if the content stored in the ROM has error.

According to another embodiment of the present invention, disclosing a method for generating a BIST signature adjustment code, the method is executed after a processor executed a code, wherein the BIST signature adjustment code is stored in a ROM, and the method comprising: acquiring the signature pattern corresponding to the BIST signature adjustment code according to a predetermined signature pattern and the signature pattern corresponding to the information of the ROM, wherein the signature pattern corresponding to the BIST signature adjustment code is N bits; using a BIST circuit to test N sets of digital code respectively to generate N sets of signature pattern, wherein each set of digital code comprises N bits, wherein in the Kth set of digital code, only the Kth bit is "1" and the rest of bits are all "0", K is any number between 1 to N; multiplying N sets of signature pattern by corresponding variable respectively, then adding each other to acquire a calculation result; setting the calculation result equal to the signature pattern of the BIST signature adjustment code to obtain N equations with N variables; and solving the N variables according to the N equations with N variables, wherein the N variables are used to be the BIST signature adjustment code.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
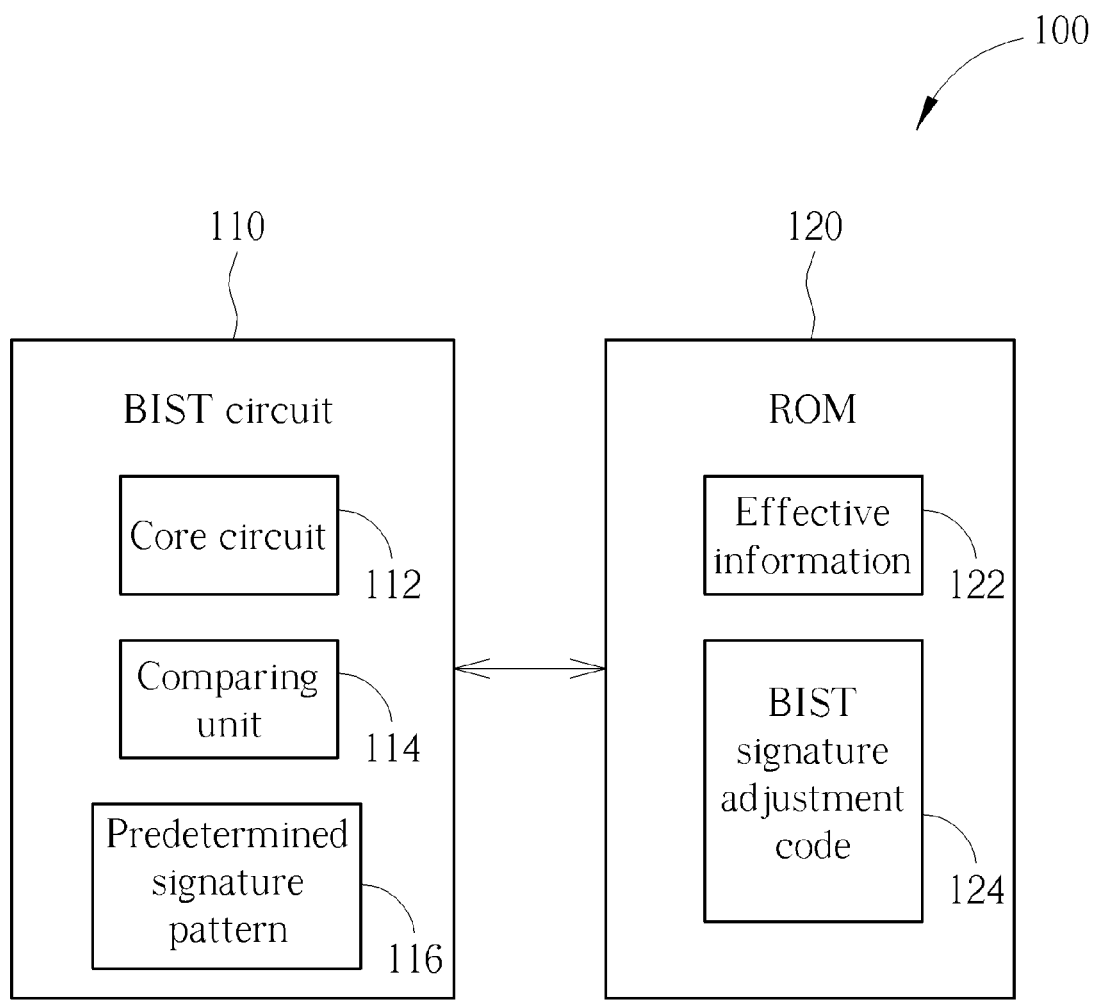
FIG. 1 is a diagram illustrating an integrated circuit with self-verification function.

Refer to FIG. 1, which is a diagram illustrating an integrated circuit 100 with self-verification function. As shown in FIG. 1, the integrated circuit 100 comprises a BIST circuit 110 and a ROM 120, wherein the BIST circuit 110 comprises a core circuit 112, a comparing unit 114 and a predetermined signature pattern 116, and the ROM 120 comprises effective information 122 and a BIST signature adjustment code 124. In this embodiment, the integrated circuit 100 can be applied in the electronic product which needs to execute BIST when every time turns on to assure that the content of the ROM 120 is correct, particularly can be applied in the electronic product which needs higher availability or correctness, for example the vehicular computer, etc.

In the BIST circuit 110, the core circuit 112 can use SISR algorithm circuit or MISR algorithm circuit, which the main function is reading every bit of the ROM 120 and generating a signature pattern accordingly, wherein the signature pattern can be composed of a plurality of digital value "0" and "1". The comparing unit 114 is arranged to compare the signature pattern generated by the core circuit 112 with a predetermined signature pattern 116 to decide if the data stored in the ROM 120 is correct then report the result to the following related circuit. More specifically, if the signature pattern generated by the core circuit 112 and the predetermined signature pattern 116 are identical, that means the data stored in the ROM 120 is correct; and if the signature pattern generated by the core circuit 112 and the predetermined signature pattern 116 are different, that means the data stored in the ROM 120 has error. In addition, in FIG. 1, the predetermined signature pattern 116 is stored in a storage unit of the BIST circuit 110, but in other embodiments, the predetermined signature pattern 116 can also be stored in the storage unit of other chips.

In this embodiment, the BIST circuit 110 executes the above-mentioned operations to decide if the content stored in the ROM 120 is correct when every time the applied electronic product turns on (for example, when every time a laptop turns on).

In the ROM 120, the effective information 122 can be any functional program instruction (program code), data, parameter or any meaningful content, etc. which stored in the ROM 120. The BIST signature adjustment code 124 is functionally irrelevant to any content of the information 122. More specifically, the BIST signature adjustment code 124 is just read and executed the related operations by the BIST circuit 110 to generate signature pattern instead of reading by other circuits to execute any substantial functional operation; in other words, even there is a circuit reads the BIST signature adjustment code 124, it won't execute any functional operation just because the BIST signature adjustment code 124.

The number of bits of the BIST signature adjustment code 124 is bigger than or equal to the number of bits of the signature pattern generated by the core circuit 112. For example, if the signature pattern generated by the core circuit 112 is 24 bits, the BIST signature adjustment code 124 is 24 bits or even more. In addition, in this embodiment, the BIST signature adjustment code 124 can be stored in the consecutive address of the ROM 120; however, in other embodiments, at least two portions of the BIST signature adjustment code 124 are stored in discontinuous addresses of the ROM 120 respectively.

In this embodiment, if the ROM 120 has an unused area, that is the area different from the effective information 122 and the BIST signature adjustment code 124, the bits of the area will be set to "0".

Figure 2:
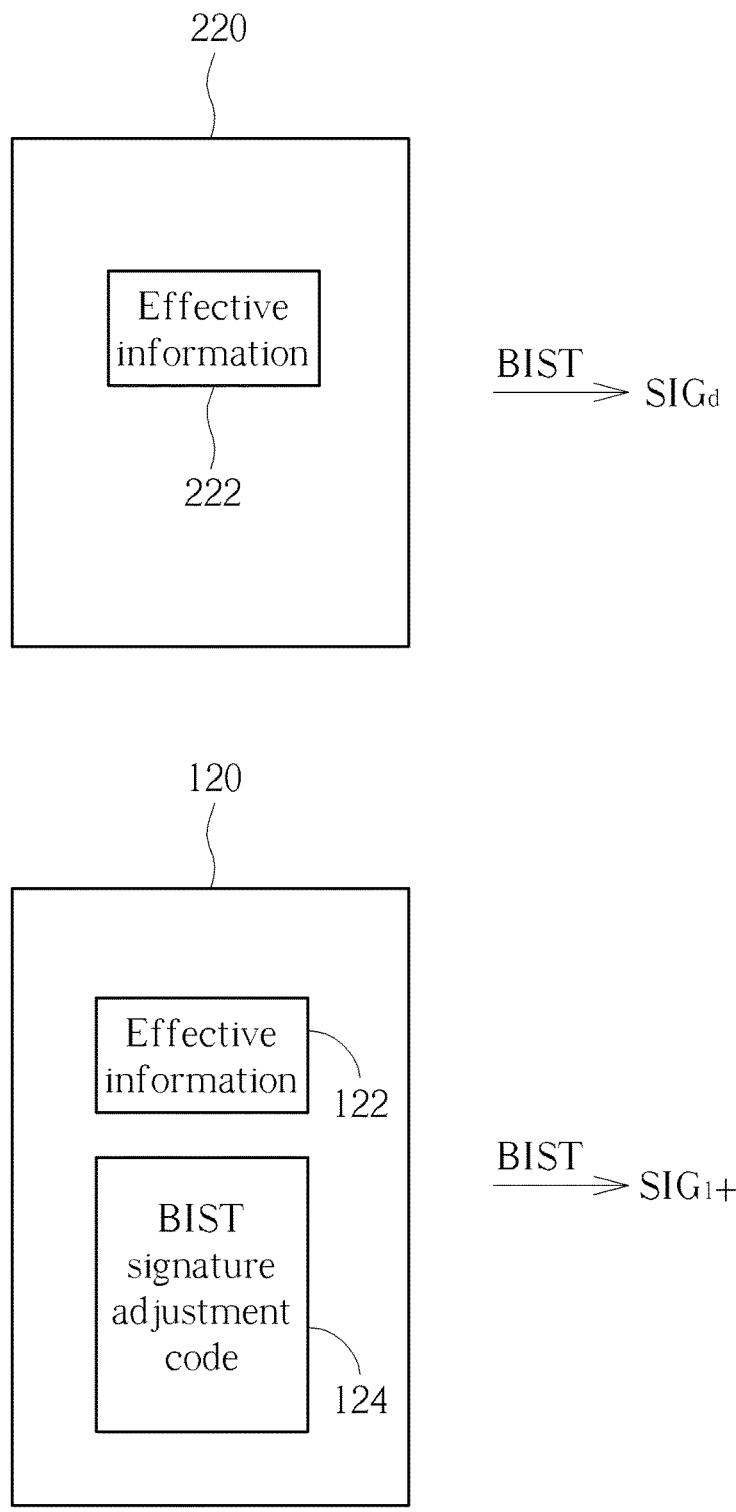
FIG. 2 is a diagram illustrating the signature patterns generated by two versions of chips.

The purpose of disposing the BIST signature adjustment code 124 in the ROM 120 of the present invention is making the signature pattern generated by the core circuit 112 the same as the signature pattern of the previous version of chip, wherein most of the content of the previous version of chip are similar with the integrated circuit 100 in FIG. 1. The main difference is the content stored in the ROM. Therefore, it can avoid adjusting the architecture of the BIST circuit 110 dramatically (i.e. the predetermined signature pattern 116 doesn't need to change). More specifically, refer to FIG. 2, assume in the previous version of chip, the ROM 220 stores the information 222, and the signature pattern generated by the BIST circuit after reading the content of the ROM 220 is $SIG_d$; however, in the integrated circuit 100 in this embodiment, the signature pattern generated by the BIST circuit after reading the content of the ROM 220 is also $SIG_d$, wherein $SIG_1$ in FIG. 2 corresponds to the signature pattern of the effective information 122, and $SIG_2$ corresponds to the signature pattern of the BIST signature adjustment code 124. As shown in FIG. 2, because the signature pattern generated by the integrated circuit 100 and the signature pattern generated by the previous version of chip are identical, that also means the stored predetermined signature patterns are the same too. Therefore, when designing the BIST circuit 110, the design of the previous version of chip can be used, particularly, the predetermined signature pattern 116 part doesn't need to be changed, so it can reduce the masks which need to redesign, and save the following costs of testing further.

Figure 3:
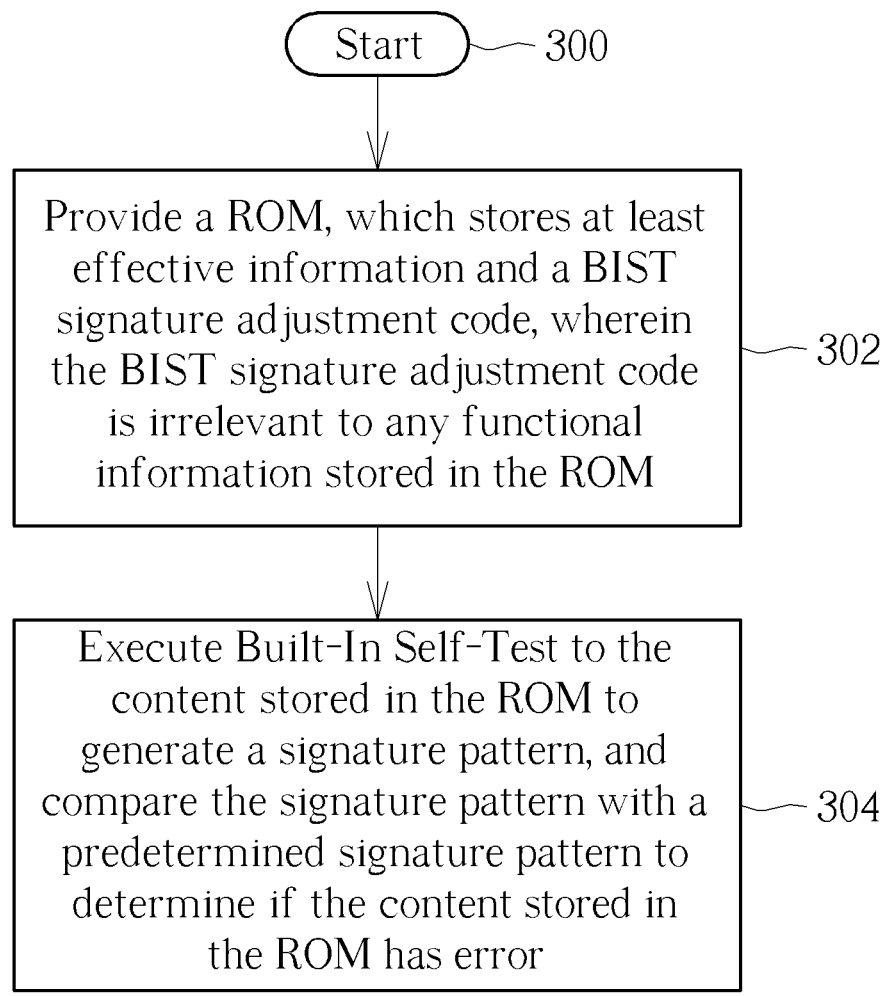
FIG. 3 is a flowchart illustrating the verification method according to an embodiment of the present invention.

Refer to FIG. 3, which is a flowchart illustrating the verification method according to an embodiment of the present invention, and refer to the disclosed content in FIG. 1 and FIG. 2, the flow of the verification method of the present invention is described as follows:

Step 300: the flow starts.

Step 302: provide a ROM, which stores at least effective information and a BIST signature adjustment code, wherein the BIST signature adjustment code is irrelevant to any functional information stored in the ROM.

Step 304: execute Built-In Self-Test to the content stored in the ROM to generate a signature pattern, and compare the signature pattern with a predetermined signature pattern to determine if the content stored in the ROM has error.

On the other hand, for deciding the content of the BIST signature adjustment code 124, because the number of bits of the signature pattern generated by the core circuit 112 is higher therefore using traditional exhaustive attack method spends too much time, so it's not suitable for deciding the BIST signature adjustment code 124. Therefore, the present invention provides a method that can find the BIST signature adjustment code 124 fast and correctly as following.

First, assume the BIST signature adjustment code 124 has N bits, wherein N is the number of bits of the signature pattern generated by the core circuit 112, and the N bits of the BIST signature adjustment code 124 are $(r_{n-1}, r_{n-2}, r_{n-3}, \ldots, r_1, r_0)$ respectively. In addition, refer to FIG. 2, because the signature pattern $SIG_d$ corresponding to the effective information 222 and the signature pattern $SIG_1$ corresponding to the effective information 122 are both known, so the signature pattern $SIG_2$ corresponding to the BIST signature adjustment code 124 equals to $(SIG_d\text{-}SIG_1)$.

As the above statements, assume f( ) means the function executed by the core circuit 112 for generating the signature pattern, then $f(r_{n-1}, r_{n-2}, r_{n-3}, \ldots, r_1, r_0)=(SIG_d-SIG_1)$.

The above-mentioned $(r_{n-1}, r_{n-2}, r_{n-3}, \ldots, r_1, r_0)$ can be represented as $r_{n-1}*(1000 \ldots 000)+r_{n-2}*(0100 \ldots 000)+r_{n-3}*(0010 \ldots 000)+ \ldots +r_1*(0000 \ldots 010)+r_0*(0000 \ldots 001)$ further, and the algorithm used by the core circuit 112 for generating the signature pattern is linear. Therefore, $f(r_{n-1}, r_{n-2}, r_{n-3}, \ldots, r_1, r_0)=r_{n-1}*f(1000 \ldots 000)+r_{n-2}*f(0100 \ldots 000)+r_{n-3}*f(0010 \ldots 000)+ \ldots + r_1*f(0000 \ldots 010)+r_0*f(0000 \ldots 001)=(SIG_d-SIG_1)$, so N equations with N variables can be acquired in this time (each bit value corresponds to an equation, and there are $(r_{n-1}, r_{n-2}, r_{n-3}, \ldots, r_1, r_0)$ N variables in total, if $f(1000 \ldots 000)$, $f(0100 \ldots 000)$, $f(0010 \ldots 000)$, ..., and $f(0000 \ldots 001)$ are linear independent to each other, then each value of $(r_{n-1}, r_{n-2}, r_{n-3}, \ldots, r_1, r_0)$ can be solved via solving the simultaneous equation, which means the BIST signature adjustment code 124 is determined).

In addition, if $f(1000 \ldots 000)$, $f(0100 \ldots 000)$, $f(0010 \ldots 000)$, and $f(0000 \ldots 001)$ are not linear independent to each other, and can't decide each value of $(r_{n-1}, r_{n-2}, r_{n-3}, \ldots, r_1, r_0)$, then the BIST signature adjustment code 124 can be assumed to have (N+1) bits and repeat the above-mentioned steps to acquire N equations with (N+1) variables to decide the (N+1) variables as the BIST signature adjustment code 124; next, if the variables still can't be decided, then assume the BIST signature adjustment code 124 has (N+2) bits continuously, and repeat the above-mentioned steps until the BIST signature adjustment code 124 is determined.

Figure 4:
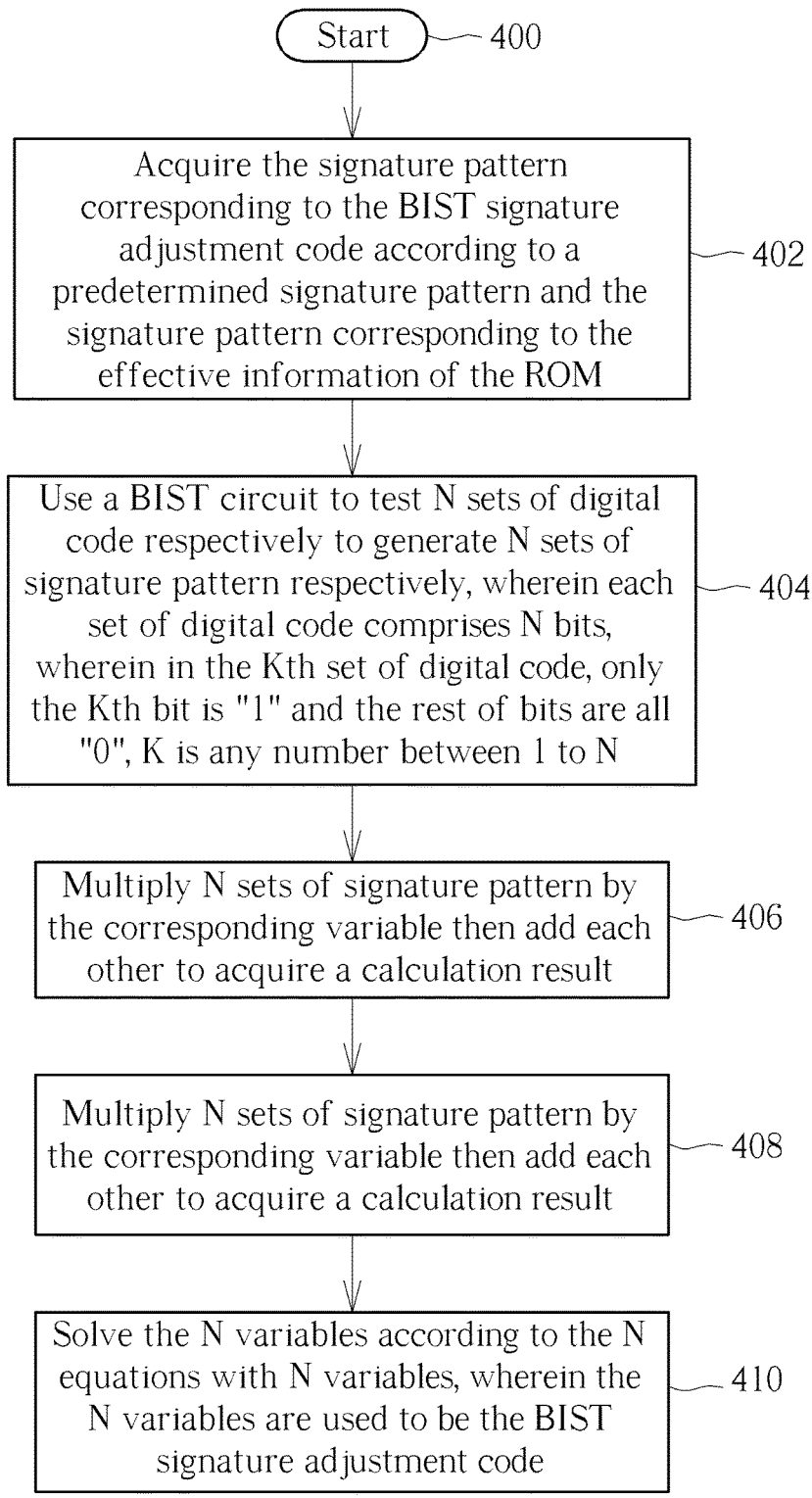
FIG. 4 is a flowchart illustrating a method for generating the BIST signature adjustment code according to an embodiment of the present invention.

Refer to the above disclosed content, the flowchart for generating the BIST signature adjustment code 124 stored in the ROM 120 is described in FIG. 4, which comprises the following steps:

Step 400: the flow starts.

Step 402: acquire the signature pattern corresponding to the BIST signature adjustment code according to a predetermined signature pattern and the signature pattern corresponding to the effective information of the ROM;

Step 404: use a BIST circuit to test N sets of digital code respectively to generate N sets of signature pattern respectively, wherein each set of digital code comprises N bits, wherein in the Kth set of digital code, only the Kth bit is "1" and the rest of bits are all "0", K is any number between 1 to N;

Step 406: multiply N sets of signature pattern by the corresponding variable then add each other to acquire a calculation result;

Step 408: set the calculation result equal to the signature pattern of the BIST signature adjustment code to acquire N equations with N variables; and Step 410: solve the N variables according to the N equations with N variables, wherein the N variables are used to be the BIST signature adjustment code.

Figure 5:
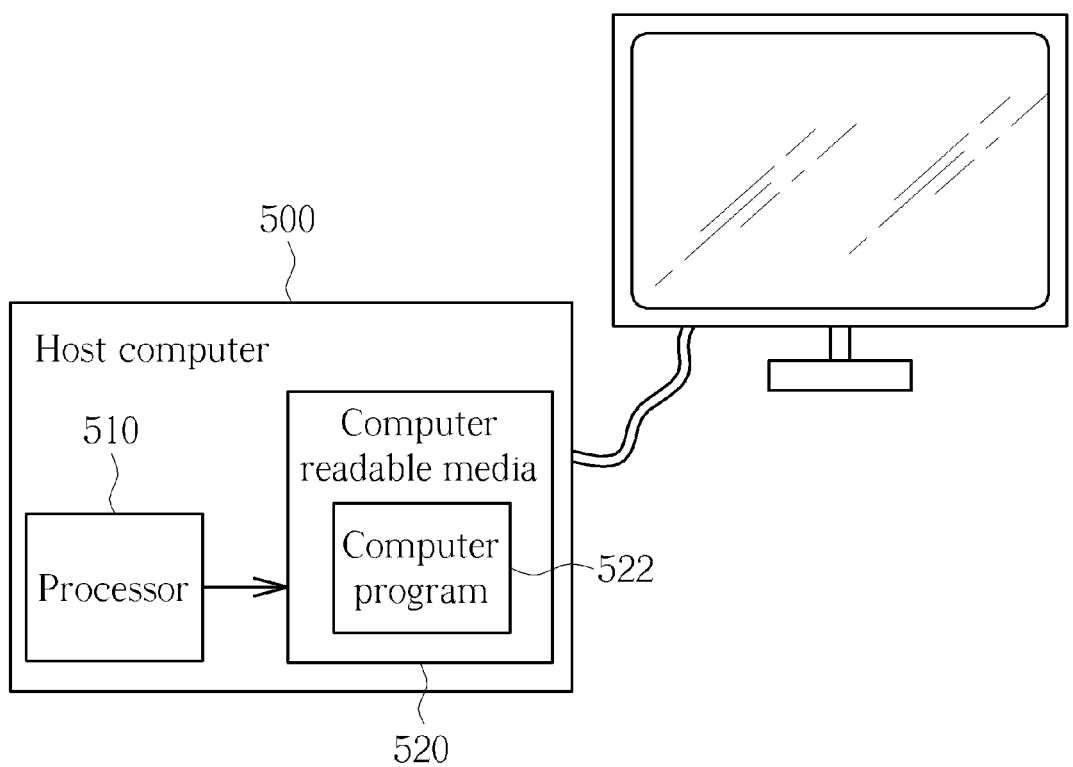
FIG. 5 is a diagram illustrating the computer readable media according to an embodiment of the present invention.

The flow shown in FIG. 4 can be executed by a computer program of a computer readable media, more specifically, refer to FIG. 5, a host computer 500 comprises at least a processor 510 and a computer readable media 520, wherein the computer readable media 520 can be a hard drive or other storage device, and the computer readable media 520 stores a computer program 522. The host computer 500 executes the steps in FIG. 4 when the processor 510 is executing the computer program 522.

In the integrated circuit and the verification method disclosed in the present invention, it makes the signature pattern generated by the BIST circuit when reading the ROM identical with the signature pattern of the previous version of chip via a BIST signature adjustment code stored in the ROM, therefore it can avoid adjusting the predetermined signature pattern part. Moreover, the present invention further discloses a method for deciding the BIST signature adjustment code, which can decide the suitable BIST signature adjustment code fast and correctly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit, comprising:
    a Built-In Self-Test (BIST) circuit;
    a predetermined signature pattern stored in the integrated circuit previously; and
    a Read Only Memory (ROM) which stores at least effective information and a BIST signature adjustment code, wherein the BIST signature adjustment code is functional irrelevant to the effective information, and a sole function of the BIST signature adjustment code is to be executed by the BIST circuit with the effective information to generate a signature pattern;
    wherein the BIST circuit tests content stored in the ROM that includes the effective information and the BIST signature adjustment code to generate the signature pattern, and compares the signature pattern with the predetermined signature pattern to determine whether the content stored in the ROM has error or not.

2. The integrated circuit of claim 1, wherein a number of bits of the BIST signature adjustment code is bigger than or equal to a number of bits of the signature pattern.

3. The integrated circuit of claim 1, wherein the BIST signature adjustment code is stored in consecutive addresses of the Rom.

4. The integrated circuit of claim 1, wherein at least two portions of the BIST signature adjustment code are stored in discontinuous addresses of the ROM respectively.

5. The integrated circuit of claim 1, wherein the integrated circuit is disposed in an electronic device, and when every time the electronic device turns on, the BIST circuit tests the content stored in the ROM to generate the signature pattern.

6. A verification method, comprising:
    providing a ROM, which stores at least effective information and a BIST signature adjustment code, wherein the BIST signature adjustment code is functional irrelevant to the effective information, and a sole function of the BIST signature adjustment code is to be executed by the BIST circuit with the effective information to generate a signature pattern; and
    executing a BIST operation to content stored in the ROM that includes the effective information and the BIST signature adjustment code to generate the signature pattern, and comparing the signature pattern with a predetermined signature pattern to determine whether the content stored in the ROM has error or not.

7. The method of claim 6, wherein a number of bits of the BIST signature adjustment code is bigger than or equal to a number of bits of the signature pattern.

8. The method of claim 6, wherein the BIST signature adjustment code is stored in consecutive addresses of the ROM.

9. The method of claim 6, wherein at least two portions of the BIST signature adjustment code are stored in discontinuous addresses of the ROM respectively.

10. The method of claim 6, wherein the method is executed by an electronic device, and when every time the electronic device turns on, the electronic device tests the content stored in the ROM to generate the signature pattern.

11. A method for generating a BIST signature adjustment code, which is executed after a processor executes a computer program, wherein the BIST signature adjustment code is to be stored in a ROM, and the method comprises:

acquiring a signature pattern corresponding to the BIST signature adjustment code according to a predetermined signature pattern and a signature pattern corresponding to effective information of the ROM, wherein the signature pattern corresponding to the BIST signature adjustment code is N bits, and N is a positive integer greater than two;

using a BIST circuit to test N sets of digital code to generate N sets of signature pattern, wherein each set of digital code comprises N bits, wherein in a Kth set of digital code, only a Kth bit is "1" and the rest of bits are all "0", and K is any number between 1 to N;

multiplying N sets of signature pattern by corresponding variables, respectively, then adding each other to acquire a calculation result, wherein the corresponding variables are the N bits of the BIST signature adjustment code;

setting the calculation result equal to the signature pattern of the BIST signature adjustment code to acquire N equations with the N variables; and solving the N variables according to the N equations with N variables, wherein the N variables are used to be the BIST signature adjustment code.

12. The method of claim 11, wherein when the N equations with N variables can't solve the N variables, the method further comprising:

(1) using the BIST circuit to test (N+M) sets of digital code respectively to generate (N+M) sets of signature pattern, wherein each set of digital code comprises (N+M) bits, wherein in the Kth set of digital code, only the Kth bit is "1" and the rest of bits are all "0", and K is any number between 1 to (N+M);

(2) multiplying (N+M) sets of signature pattern by corresponding variables, respectively, then adding each other to acquire a calculation result;

(3) setting the calculation result equal to the signature pattern of the BIST signature adjustment code to acquire N equations with (N+M) variables; and (4) solving the (N+M) variables according to the N equations with (N+M) variables, wherein the (N+M) variables are used to be the BIST signature adjustment code;

(5) letting M plus 1 when the N equations with (N+M) variables can't solve the (N+M) variables, and repeating the steps (1) to (5) until solving all variables for being the BIST signature adjustment code.

* * * * *